United States Patent [19]

Veenstra

[11] Patent Number: 5,359,242
[45] Date of Patent: Oct. 25, 1994

[54] PROGRAMMABLE LOGIC WITH CARRY-IN/CARRY-OUT BETWEEN LOGIC BLOCKS

[75] Inventor: Kerry Veenstra, San Jose, Calif.
[73] Assignee: Altera Corporation, San Jose, Calif.
[21] Appl. No.: 6,321
[22] Filed: Jan. 21, 1993
[51] Int. Cl.⁵ .............................. H03K 19/177
[52] U.S. Cl. ................... 307/465; 307/472; 364/788
[58] Field of Search ........... 307/465, 471, 472, 465.1; 365/189.08; 364/716, 787, 788

[56] References Cited

U.S. PATENT DOCUMENTS 4,758,746  7/1988  Birkner et al. ............... 307/465

FOREIGN PATENT DOCUMENTS 0260033  3/1988  European Pat. Off. ..... H03K 17/60

OTHER PUBLICATIONS

Egan, "MAX 7000 family faster, denser, more flexible than MAX 5000 parts," *Computer Design* (1992) 31:118.
Agarwala et al., "Application Specific Logic Module Architecture for FPGAs," *IEEE 1992 Custom Integrated Circuits Conference*, pp. 4.1.1–4.1.4.
Bursky, "FPGA Advances Cut Delays, Add Flexibility," *Electronic Design* (1992) 40:35–43.

*Primary Examiner*—David R. Hudspeth
*Attorney, Agent, or Firm*—Townsend and Townsend Khourie and Crew

[57] ABSTRACT

A programmable logic device. The device includes reprogrammable logic for generating at least one sum-of-products signal (113) and a control term (115). The device further includes a sum-of-products processing circuit (201). The sum of products processing circuit is adapted to produce a logical XOR of the control term and the sum-of-products term when a carry-in signal (203) from adjacent reprogrammable logic is disabled, and a sum of the carry-in bit, the sum-of-products term, and the control term when the carry-in bit is enabled. Signal storage means (118) is coupled to an output of the sum-of products processing circuit.

21 Claims, 4 Drawing Sheets

PROGRAMMABLE LOGIC WITH CARRY-IN/CARRY-OUT BETWEEN LOGIC BLOCKS

BACKGROUND OF THE INVENTION

The present invention relates to the field of programmable logic and devices therefor. More specifically, in one embodiment the invention provides an improved programmable logic device with that is especially useful in implementation of arithmetic functions, as well as associated methods of operation.

Programmable logic devices (PLDs) are well known to those in the electronics art. Such programmable logic devices are commonly referred to as PALs (Programmable Array Logic), PLAs (Programmable Logic Arrays), FPLAs (Field Programmable Logic Arrays), PLDs (Programmable Logic Devices), EPLDs (Erasable Programmable Logic Devices), EEPLDs, LCAs (Logic Cell Arrays), FPGAs (Field Programmable Gate Arrays), and the like. Such devices are used in a wide array of applications where it is desirable to program standard, off the shelf devices for a specific application. Such devices include, for example, the well known Classic ™ EPLDs and MAX ® 5000 EPLDs made by Altera ®.

While such devices have met with substantial success, such devices also meet with certain limitations. For example, when such devices are programmed to perform an addition function, such devices are not as efficient as could be hoped because carry operations use excessive resources when they are implemented on such devices. Specifically, according to one implementation of an add function in an EPLD, a single macrocell is used for each bit of the add, and an additional macrocell is needed for every third bit for carry generation. In addition, "expanders" are used for implementation of such add functions that provide "bit generate" and "bit propagate" signals, such as described in Langdon, *Computer Design*, 1982, pp. 494. Use of these resources not only reduces the capacity of the device to perform many functions, but also slows operation of the device.

From the above it is seen that an improved programmable logic device is desired.

SUMMARY OF THE INVENTION

An improved programmable logic device is provided by virtue of the present invention. The device may be readily programmed to perform a wide variety of logic functions efficiently, including functions such as an add.

The invention provides for replacement of a conventional XOR gate in a programmable logic device with a processing circuit including an adder in a preferred embodiment. The adder produces a logical XOR of two inputs from programmable logic when a carry-in bit to the adder is disabled. However, when the carry-in bit is enabled, the adder produces a least significant bit and a most significant bit, wherein the most significant bit is made available to adjacent logic as a carry-in and the least significant bit is provided as input to a signal storage circuit such as a d-type flip-flop.

According to one aspect of the invention, the device provides a programmable logic device including reprogrammable logic for generating at least one sum-of-products term and a control term. The circuit also includes a sum-of-products processing circuit, the sum of products processing circuit adapted to produce a logical XOR of the control term and the sum-of-products term when a carry-in bit from adjacent reprogrammable logic is disabled, and a sum of the carry-in bit, the sum-of-products term, and the control term when the carry-in bit is enabled. The device further includes signal storage means coupled to an output of the sum-of-products processing circuit.

A further understanding of the nature and advantages of the inventions herein may be realized by reference to the remaining portions of the specification and the attached drawings.

DESCRIPTION OF THE PREFERRED EMBODIMENTS

Programmable logic devices are well known to those of skill in the art. One such device provides for an array of AND gates or product terms with programmable inputs, such as described in U.S. Pat. No. 4,617,479, assigned to the assignee of the present invention and incorporated herein by reference for all purposes.

Figure 1:
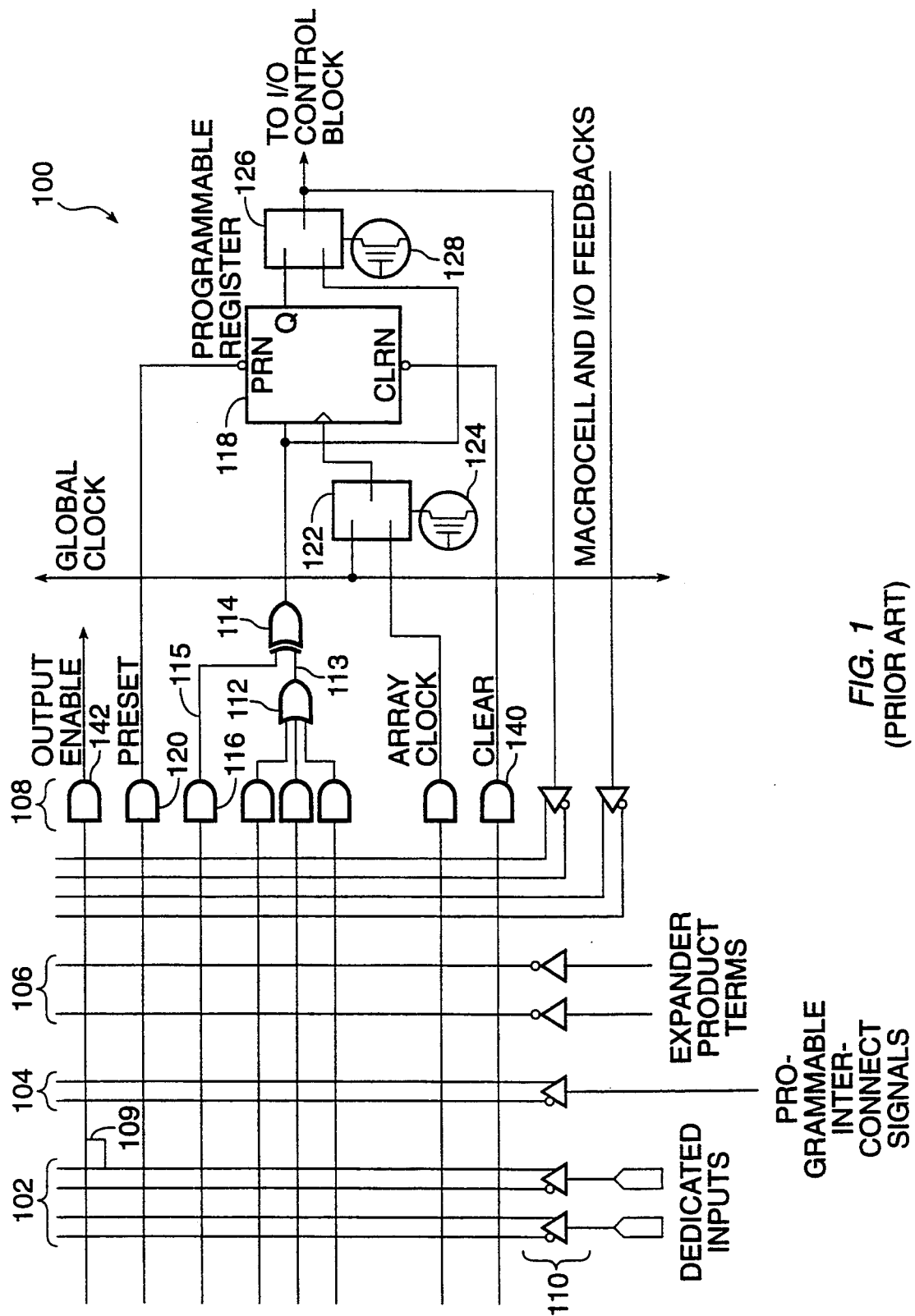
FIG. 1 is an illustration of a prior art programmable logic device.

FIG. 1 represents a logic block or "macrocell" 100 of one such programmable logic device. As shown therein, the device receives inputs from one or more of a plurality of dedicated input lines 102, programmable macrocell interconnect lines 104, and/or expander product terms 106. Each of the input lines are selectively connectable to AND array 108 using programmable devices 109 such as EPROM transistors. It will be recognized that an EPROM transistor is provided at the intersection of each input line and the lines entering each AND gate, although only a single transistor is shown for simplicity. Each input and signal is available as both the true and complement of the signal via inverters 110. The dedicated input lines receive input from external sources such as chip input pads. The programmable interconnect signals are signals generated by the output(s) of each of the macrocells in an array. The expander product terms are terms that are shared between macrocells in the array via a product expander, enabling the device to implement highly complex logic functions efficiently.

Several of the various "product" terms generated at the output of the AND array are input to an OR gate 112 to generate a sum-of-products term or signal 113 at the output thereof. The sum-of-products (SOP) term, along with an additional product term or signal 115, are input to a XOR gate 114. The product term 115 is generated by AND gate 116, which also has programmable inputs, and is referred to herein as an inversion term. This XOR gate, based on the output of the AND gate 116, acts to invert (when it is active) or not invert (when it is inactive) the SOP term.

The output of the XOR gate 114 is input to register 118. Register 118 can be programmed, via SRAM bits, EPROM transistors, or other memory (not shown), to act as, for example, a D-type, a T-type, a JK-type, or a SR-type flip-flop. The flip-flop is provided with preset and clear inputs, via AND gates 120 and 140 respectively, also with programmable inputs. The clock input to the flip-flop 118 is selected from either a global clock (synchronous) or an asynchronous array clock (from AND gate 120, also with programmable inputs). The clock selection is made using a multiplexer 122 having a programmable selection input from a programmable device 124 such as an SRAM bit or EPROM transistor.

The output of the flip-flop and the input to the flip-flop are input to multiplexer 126. Multiplexer 126 selects between the register output and the register input based on the value stored in a programmable device 128 such as an SRAM bit or an EPROM cell. The output from the multiplexer 126 is output to an input/output control block and provided for input as macrocell and input/output feedback loops. Output enable performs the function of enabling a tri-statable output driver (not shown), based on output from AND gate 142, also having programmable inputs.

Figure 2:
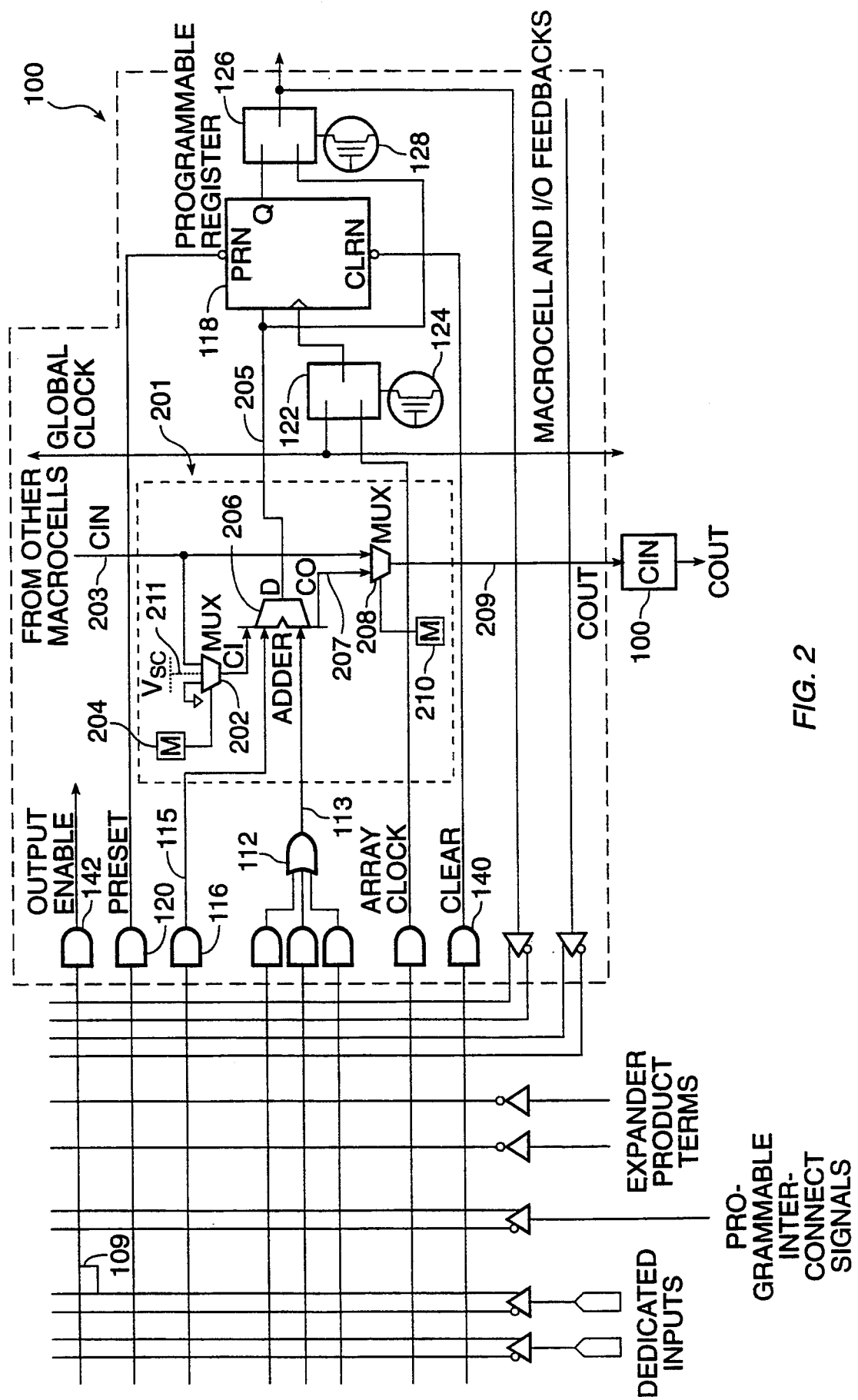
FIG. 2 illustrates a circuit for formation and use of carry-out/in signals in a programmable logic device according to the present invention.

The logic device illustrated above operates efficiently in most applications; there are, however, applications where performance of the device can be improved such as in binary adders. Accordingly, the invention herein uses a programmable multiplexer circuit 201 as shown in FIG. 2 in place of the XOR gate of a programmable logic device.

As in the above embodiment, the invention provides for the use of an array of AND gates having programmable inputs according to one embodiment. It will be recognized that the invention is illustrated herein with respect to programmable logic using an array of AND gates with programmable EPROM or EEPROM inputs, but other types of programmable logic may be utilized in some embodiments. For example, the programmable logic may in some embodiments be an array of SRAM bits that are addressed based on the various inputs.

According to one aspect of the invention herein, the XOR gate 114 is replaced with appropriate logic 201 for incorporation of a carry-in bit from another macrocell. According to one specific embodiment, the logic provides the same invert select function as a standard XOR gate when the carry-in bit or signal 203 is "disabled" via, for example, a multiplexer 202. The multiplexer disables the CIN bit by selecting a grounded input. While multiplexer 202 has one input connected to ground, the other input is connected to a carry-in bit (CIN) from another macrocell. The output from the multiplexer 202 is selected from the inputs based on SRAM, EPROM, EEPROM, or other memory 204. The output CI of multiplexer 202 will be ground when the carry bit is to be disabled. Alternatively, CI will take on the value of the carry bit CIN when the carry bit is selected via the multiplexer.

An adder 206 inputs the value selected from the multiplexer 202, as well as the sum-of-products term and the product term from AND gate 116. The least significant bit (D) or signal 205 from the adder is input to the flip-flop 118 in the same way as the output from the XOR gate in prior embodiments. In addition, the most significant bit or signal 207 is output as a carry bit (CO) to the next macrocell.

According to a preferred embodiment of the invention, a second multiplexer 208 selects between the carry-out bit CO from the adder 206 and the carry-in bit CIN for output to an adjacent macrocell 100 as a carry-in bit or signal 209. This selection is made based on the contents of SRAM, EPROM, EEPROM, or other memory 210. In this manner, the carry-in bit 203 to the macrocell shown in FIG. 2 may be passed through the macrocell to the adjacent macrocell without further processing. This provides the benefit of, for example, flexibility in fitting designs since adjacent bits of the adder need not be placed immediately adjacent in the PLD.

A truth table for an adder according to one aspect of the invention is shown in Table 1.

TABLE 1

| Adder Truth Table | | | | |
|---|---|---|---|---|
| Inputs | | | Outputs | |
| A | B | CI | CO | D |
| 0 | 0 | 0 | 0 | 0 |
| 0 | 0 | 1 | 0 | 1 |
| 0 | 1 | 0 | 0 | 1 |
| 0 | 1 | 1 | 1 | 0 |
| 1 | 0 | 0 | 0 | 1 |
| 1 | 0 | 1 | 1 | 0 |
| 1 | 1 | 0 | 1 | 0 |
| 1 | 1 | 1 | 1 | 1 |

As seen from the above truth table, in the degenerate case (where CIN is disabled by the multiplexer), the value of D is the same as that of a XOR gate of the prior embodiments. That is, when CIN is disabled by the multiplexer 202, the value of D tracks that of the output of a XOR gate with inputs 113 and 115 from AND gate 116 and OR gate 112, respectively. However, when the user desires to have the macrocell function in the role of, for example, an adder, the carry-in bit from an adjacent macrocell is enabled with the selection bit 204 for multiplexer 202. Further, when it is desired to use the carry-out bit from the adder 206 in the next macrocell, the selection bit 210 is appropriately set for selection of the carry-out bit COUT. Incorporation of the adder/multiplexer scheme shown herein has several benefits, including efficient implementation of adders, and the like. This arises because in is possible to use fewer macrocells in the implementation of an add.

In an alternative embodiment, multiplexer 202 is provided with an optional additional input 211 that is coupled to Vcc (along with an extra selection bit). Accordingly, multiplexer 202 can select between ground, Vcc, and CIN. When such additional input is provided, the carry logic may be used to implement a subtracter.

A subtracter works as follows. In general, the difference between two inputs A and B is defined by:

$$Difference = A - B = A + (-B)$$

In two's complement notation:

$$-B = (NOT\ B) + 1$$

Therefore:

$$A + (-B) = A + (NOT\ B) + 1 = Difference$$

Therefore, to implement a subtract, A drives the product term 115, while the B term is inverted and drives sum terms 113. A "1" is added to the result by setting the carry-in of the first bit to 1 with multiplexer 202. Accordingly, the invention is easily modified for subtracter implementation.

Figure 3:
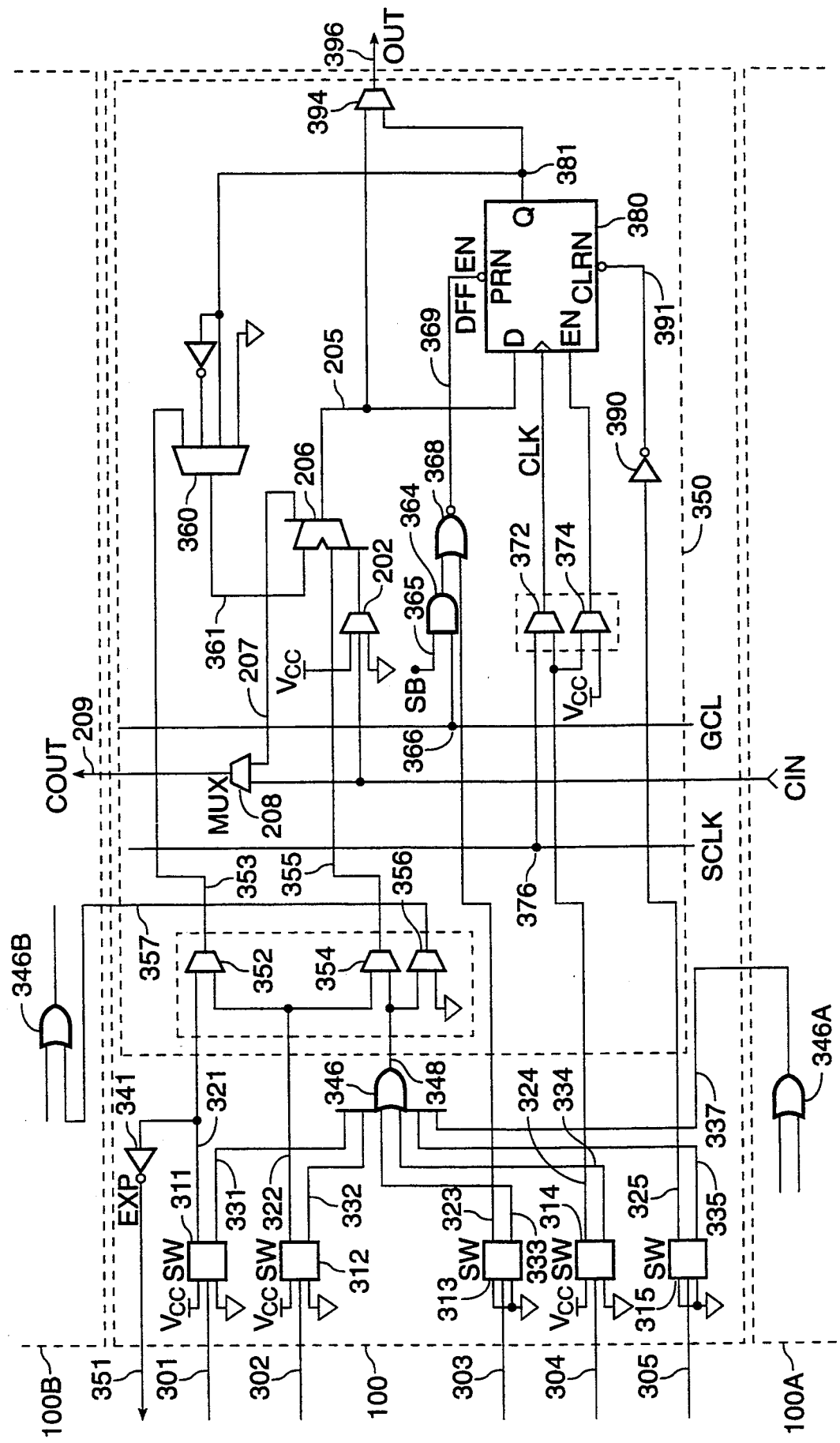
FIG. 3 illustrates an implementation of the invention in a different programmable logic device.

Another embodiment of the invention, illustrated in FIG. 3, has five product terms 301–305 as inputs to macrocell 100. Each of product terms 301–305 is coupled to a respective one of programmable switches 311–315. A static architecture bit corresponds to each programmable switch 311–315. Based on the state of its static architecture bit, each of programmable switches 311–315 selects as outputs two of its three inputs. A static architecture bit can be implemented conventionally by, for example, storing charge in a floating gate memory cell or by blowing a fuse.

Using programmable switch 311 as an example, if its static architecture bit is HIGH, product term 301 appears at output 321 and a static LOW appears at output 331. If its static architecture bit is LOW, a static HIGH appears on output 321 and product term 301 appears on output 331. Programmable switches 312 and 314 perform in the same manner. For programmable switches 313 and 315 a static LOW output replaces the static HIGH output, because these switches have a second input connected to ground in place of an input connected to Vcc.

Each product term 301–305 can be configured by means of the programmable switches 311–315 to act as an input either to OR gate 346 or to an alternate destination within register means 350. The alternate destinations for product terms 301 and 302 are the inputs to adder 206. The alternate destination for product term 301 also includes external output 351; via invertor 341. The alternate destinations for product terms 303–305 are the secondary inputs to register 380.

OR gate 346 receives inputs 331–335 from programmable switches 311–315 and from input 337. Input 337 represents an input received from a first adjacent macrocell 100A. First adjacent macrocell 100A may or may not be the same as macrocell 100, but it must contain an OR gate 346A for summing product terms.

Inputs 331–335 each provide either a product term or a static LOW signal depending on the states of the static architecture bits controlling the programmable switches 311–315. Thus, OR gate 346 performs an OR function on a selected group of product terms and provides the sum of those product terms as an output.

Multiplexer 356 provides a mechanism for selecting either the output of OR gate 346 or a static LOW to serve as external output 357. Output 357 is input to the OR gate 346B of a second adjacent macrocell 100B in the same manner that input 337 is an input to OR gate 346A. Macrocell 100B may or may not be the same as macrocell 100, but it must include an OR gate 346 for summing input product terms. By selecting the output of OR gate 346 to serve as external output 357, an arbitrarily wide OR function can be implemented across a series of adjacent macrocells. The process of linking the OR gates across a series of macrocells is known as daisy chaining. In the illustrative embodiment OR gate 346 has six inputs; therefore, by daisy chaining two adjacent macrocells, an eleven input OR function can be implemented.

The process by which product terms are directed to alternate destinations depending on the states of static architecture bits is called product term steering. Because macrocells are commonly used to implement a sum-of-products architecture, it is often desirable to daisy chain OR gates to obtain the sum of a large number of product terms. Sometimes not all the product terms in a macrocell are utilized in the OR function. By steering unused product terms to the input to XOR gate 362 or to the secondary inputs to register 380, these unused product terms can still implement useful logic.

The logic associated with adder 206 and register 380 will be used to direct the output of OR gate 346 to external output 396 when CIN is disabled by the multiplexer 202. Alternatively, when multiplexer 202 is enabled to transmit CIN, the device may act as an adder. In this particular embodiment, still greater flexibility is provided by allowing multiplexer 202 to select between Vcc, CIN, and ground.

When a macrocell receives an input from the OR gate of an adjacent macrocell, it utilizes the product terms directed to that OR gate. Using product terms from an adjacent macrocell can be referred to as adjacent product term stealing. Allocating some of a macrocell's product terms to an OR gate and the remaining product terms to registered logic can be referred to as product term allocation.

When not daisy chained to an adjacent macrocell via output 357, the output 348 of OR gate 346 serves as an input to multiplexer 354. The output of multiplexer 354 serves as an input to adder 206. A static architecture bit determines whether multiplexer 354 selects the output of OR gate 346 or the output of programmable switch 312 as its output. The output of programmable switch 312 is either product term 302 or a static HIGH signal, depending on the state of the static architecture bit corresponding to programmable switch 312. Therefore, the output of multiplexer 354 is a static HIGH, product term 302 or the output of OR gate 346 depending on the states of two static architecture bits. In the present embodiment, multiplexer 352, multiplexer 354 and multiplexer 356 are all controlled by a single static architecture bit, although in alternate embodiments each could be controlled separately. By controlling three elements with one bit, product term 302 can be routed through multiplexer 352 or through multiplexer 354, but not through both. Likewise, the output of OR gate 346 can be routed through multiplexer 354 or multiplexer 356 but not both.

Multiplexer 352 selects between output 322 of switch 312 or output 321 of switch 311. Therefore, the output 353 of multiplexer 352 is product term 301, product term 302 or a static HIGH. Output 321 also serves as an input to invertor 341 which drives an external output signal 351.

Adder 206 receives inputs from multiplexer 354 and multiplexer 360. Multiplexer 360 selects as its output one of four inputs based on the states of two static architecture bits. Multiplexer 360 selects from among the output 381 of register 380, the inverse of the output of register 380, a static LOW, and an output 353 from multiplexer 352 (which is product term 301, product term 302 or a static HIGH). Product term 302, a static HIGH or the output of OR gate 346 is input to adder 206 via multiplexer 354. By properly selecting the inputs to adder 206, register 380 can be used to implement D or T flip-flops with inversion control on the D or T inputs, when CIN is disabled.

The output 205 of adder 206 feeds the D input of register 380 and an input to multiplexer 394. The output of register 380 provides the second input to multiplexer 394. The state of a static architecture bit determines which input multiplexer 394 selects to be external ouptut 396.

Register 380 receives CLOCK, ENABLE, PRESET and asynchronous CLEAR inputs. NOR gate 368 provides the CLEAR input 369 for register 380. The first input to NOR gate 368 comes from output 323 of programmable switch 313, which provides either product term 303 or a static LOW as input. AND gate 364 provides the other input to NOR gate 368. A global CLEAR signal, GCLR, for use in conjunction with all the macrocells in a device, provides a first input to AND gate 364. The global CLEAR function can be progammatically disabled by static architecture bit SB which provides the second input 365 to AND gate 364.

Product term 305, selected by programmable switch 315 and inverted by invertor 390 provides the PRESET input 391 to register 380. Therefore, the PRESET input 391 can be programmably disabled via the static architecture bit that controls programmable switch 315.

Multiplexer 372 and multiplexer 374, which are preferably controlled in this embodiment by a single static architecture bit, provide the CLOCK and ENABLE inputs 373, 375, respectively, to register 380. The CLOCK input derives either from a global clock signal SCLK 376 common to all macrocells within a device or from product term 304 via programmable switch 314 on output 324. Product term 304 is also input to multiplexer 374, but is connected in this embodiment such that depending on the state of the static architecture bit controlling multiplexers 372 and 374, product term 304 is passed through only one of the multiplexers 372, 374. The second input to multiplexer 374 is a static HIGH. Therefore, product term 304 serves either as a CLOCK signal via multiplexer 372 or as a synchronous clock ENABLE signal via multiplexer 374 in conjunction with the global clock signal SCLK 376. Thus in the present embodiment, product term 304 provides either a clock signal via multiplexer 372 with a static HIGH serving as ENABLE via multiplexer 374, or a global clock signal SCLK 376 serves as CLOCK with product term 304 acting as a synchronous clock ENABLE via multiplexer 374.

Figure 4:
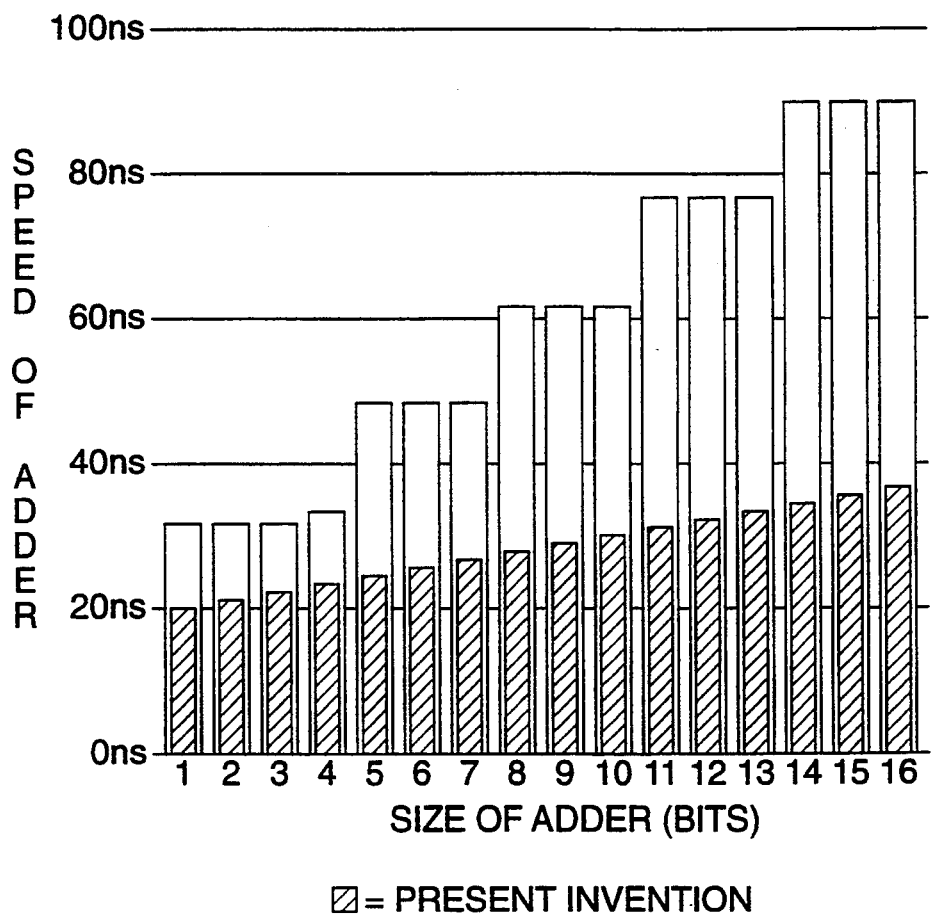
FIG. 4 illustrates adder speed versus adder size, comparing actual data with simulations of the present invention.

FIG. 4 compares the speed of an adder implemented according to the present invention with that of a typical programmable device. As seen, the device according to the present invention is significantly faster, particularly for a large number of bits as inputs to the adder. For example, a 16-bit adder (in an EPM 7096QC100-2) has a propagation time of 90 nanoseconds. With this invention the propagation time would be about 35 nanoseconds.

The above description is illustrative and not restrictive. Many variations of the invention will become apparent to those of skill in the art upon review of this disclosure. Merely by way of example the invention will find application in conjunction with various types of programmable logic such as EEPROM- or SRAM-based programmable logic and the like. The scope of the invention should, therefore, be determined not with reference to the above description, but instead should be determined with reference to the appended claims along with their full scope of equivalents.

What is claimed is:

1. A programmable logic device comprising:
an array of AND gates coupled to logic inputs;
an OR gate for producing a logic OR of outputs of selected AND gates;
an adder for adding an output of one of said AND gates and an output of said OR gate, a carry input to said adder coupled to a multiplexer output, and multiplexer selecting between at least ground and a carry output from an adjacent adder;
a flip-flop for storing an output of said adder;
an output selection multiplexer selecting between said output of said adder and an output of said flip-flop; and
a carry-out multiplexer selecting between a carry-out output of said adder and said carry output of said adjacent adder for output to a second adjacent adder.

2. A method of implementing logical functions in a reprogrammable logic in a logic array comprising the steps of:
generating a sum-of-products term and a control term;
producing a logical XOR of said sum-of-products term and said control term when a carry-in bit to said logic array is disabled; and
producing a sum of said carry-in bit, said sum-of-products term, and said control term when said carry-in bit is enabled.

3. The method as recited in claim 2 wherein said step of generating a sum-of-products term comprises a step of addressing an SRAM bit based on a plurality of inputs.

4. The method as recited in claim 2 wherein said step of producing a sum also produces a carry-out bit to adjacent member of said logic array.

5. The method as recited in claim 4 further comprising the step of selecting between said carry-in bit and said carry-out bit for input to said adjacent member of said logic array.

6. The method as recited in claim 2 further comprising the step of selecting between carry-in bit and ground in a multiplexer for input to said step of producing a sum.

7. The method as recited in claim 2 further comprising the step of storing said sum in a flip-flop.

8. A programmable logic device comprising:
reprogrammable logic for generating at least one sum-of-products term and a control term;
a sum-of-products processing circuit, said sum-of-products processing circuit producing a logical XOR of said control term and said sum-of-products term when a carry-in bit from adjacent reprogrammable logic is disabled, and a sum of said carry-in bit, said sum-of-products term, and said control term when said carry-in bit is enabled; and
signal storage means coupled to an output of said sum-of-products processing circuit, wherein said reprogrammable logic comprises a plurality of SRAM bits, said sum-of-products term produced by selection of a value stored in one of said SRAM bits.

9. A programmable logic device comprising:
reprogrammable logic for generating at least one sum-of-products term and a control term;
a sum-of-products processing circuit, said sum-of-products processing circuit producing a logical XOR of said control term and said sum-of-products term when a carry-in bit from adjacent reprogrammable logic is disabled, and a sum of said carry-in bit, said sum-of-products term, and said control term when said carry-in bit is enabled, wherein said sum-of-products processing circuit is further adapted to produce a carry-out bit coupled to an adjacent sum-of-products processing circuit;
signal storage means coupled to an output of said sum-of-products processing circuit; and
a multiplexer coupled to said carry-out bit and said carry-in bit, said multiplexer selecting between output of said carry-out bit and said carry-in bit for input to adjacent sum-of-products processing circuitry.

10. A programmable logic device comprising:
reprogrammable logic for generating at least one sum-of-products term and a control term;
a sum-of-products processing circuit, said sum-of-products processing circuit producing a logical XOR or said control term and said sum-of-products term when a carry-in bit from adjacent reprogrammable logic is disabled, and a sum of said carry-in bit, said sum-of-products term, and said control term when said carry-in bit is enabled;
signal storage means coupled to an output of said sum-of-products processing circuit;
an OR gate for ORing outputs of a plurality of switches;
an input to said OR gate coupled to an output of an OR gate in first adjacent programmable logic; and
an output of said OR gate selectively coupled to an input of an OR gate in second adjacent reprogrammable logic.

11. A programmable logic device comprising:
reprogrammable logic for generating at least one sum-of-products term and a control term, said control term a logical AND of selected programmable logic inputs;
a sum-of-products processing circuit, said sum-of-products processing circuit producing a logical XOR of said control term and said sum-of-products term when a carry-in bit from adjacent reprogrammable logic is disabled, and a sum of said carry-in bit, said sum-of-products term, and said control term when said carry-in bit is enabled; and
signal storage means coupled to an output of said sum-of-products processing circuit.

12. A programmable logic device as recited in claims 8, 9, 10 or 11 wherein said reprogrammable logic comprises a plurality of AND gates selectively coupled to plural input lines.

13. A programmable logic device as recited in claims 9, 10 or 11 wherein said reprogrammable logic comprises a plurality of SRAM bits, said sum-of-products term produced by selection of a value stored in one of said SRAM bits.

14. A programmable logic device as recited in claims 8, 10 or 11 wherein said sum-of-products processing circuit is further adapted to produce a carry-out bit coupled to an adjacent sum-of-products processing circuit.

15. A programmable logic device as recited in claim 14 further comprising a multiplexer coupled to said carry-out bit and said carry-in bit, said multiplexer selecting between output of said carry-out bit and said carry-in bit for input to adjacent sum-of-products processing circuitry.

16. A programmable logic device as recited in claims 8, 9, 10 or 11 wherein said carry-in bit is enabled or disabled with a multiplexer that selects among input of said carry-in bit and ground for use in said sum-of-products processing circuit.

17. A programmable logic device as recited in claims 8, 9, 10 or 11 wherein said signal storage circuit is configurable as a d-type flip-flop.

18. A programmable logic device as recited in claims 8, 9, 10 or 11 wherein said signal storage circuit is configurable as a d-type flip-flop, a t-type flip-flop, a jk-type flip-flop, or a sr-type flip-flop depending on configuration control information stored in said logic device.

19. A programmable logic device as recited in claims 8, 9 or 11 wherein said reprogrammable logic further comprises:
an OR gate for ORing outputs of a plurality of switches;
an input to said OR gate coupled to an output of an OR gate in first adjacent programmable logic; and
an output of said OR gate selectively coupled to an input of an OR gate in second adjacent reprogrammable logic.

20. A programmable logic device as recited in claim 16 wherein said multiplexer selects among input of said carry-in bit, ground, and a logic level 1, whereby said programmable logic device may implement a subtract function.

21. A programmable logic device as recited in claims 8, 9 or 10 wherein said control term is a logical AND of selected programmable logic inputs.

* * * * *